United States Patent
Brech

(10) Patent No.: US 7,126,192 B2
(45) Date of Patent: Oct. 24, 2006

(54) TRANSISTOR WITH REDUCED GATE-TO-SOURCE CAPACITANCE AND METHOD THEREFOR

(75) Inventor: Helmut Brech, Phoenix, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 11/350,305

(22) Filed: Feb. 8, 2006

(65) Prior Publication Data

US 2006/0125004 A1   Jun. 15, 2006

(51) Int. Cl.
*H01L 29/76* (2006.01)

(52) U.S. Cl. ........................ 257/341; 257/401

(58) Field of Classification Search ................ 257/341, 257/401, 409
See application file for complete search history.

(56) References Cited

U.S. PATENT DOCUMENTS

| | | | |
|---|---|---|---|
| 5,025,296 A | 6/1991 | Fullerton et al. | |
| 5,434,095 A | 7/1995 | Hollinger | |
| 5,592,006 A | 1/1997 | Merrill | |
| 5,614,751 A | 3/1997 | Yilmaz et al. | |
| 5,886,938 A | 3/1999 | Haukness | |
| 6,023,086 A | 2/2000 | Reyes et al. | |
| 6,744,117 B1 * | 6/2004 | Dragon et al. | 257/659 |
| 6,864,533 B1 * | 3/2005 | Yasuhara et al. | 257/342 |
| 6,943,410 B1 * | 9/2005 | Fujihira et al. | 257/339 |
| 7,067,876 B1 * | 6/2006 | Yasuhara et al. | 257/335 |

* cited by examiner

*Primary Examiner*—T. N. Quach
(74) *Attorney, Agent, or Firm*—Daniel D. Hill; James L. CLingan, Jr.

(57) ABSTRACT

A power transistor, formed from transistors connected in parallel, each transistor is formed in an active region using a relatively long gate called a gate finger that is typically formed from polysilicon that accumulates resistance over its length. To alleviate this, the gate finger is strapped to a metal line at tabs adjacent to the finger gate over the active area, typically over the source, but the tabs add gate-to-source capacitance. This was previously quite small but as gate dielectrics have gotten thinner there is more capacitive coupling to the substrate by the tabs, and as gates have gotten thinner there is more resistance in the polysilicon finger gates. Both have the effect of increasing the RC time constant of the gate finger. This increase in RC time constant is alleviated by increasing the thickness of the dielectric separating the tabs from the substrate thereby reducing the capacitance caused by the tabs.

23 Claims, 4 Drawing Sheets

TRANSISTOR WITH REDUCED GATE-TO-SOURCE CAPACITANCE AND METHOD THEREFOR

FIELD OF THE INVENTION

The present invention relates generally to field effect transistors, and more particularly, to a field effect transistor with reduced gate-to-source capacitance.

BACKGROUND OF THE INVENTION

One type of high power transistor uses a plurality of polysilicon gate fingers located in an active area of a silicon substrate. A source and drain region are formed on each side of each of the gate fingers. A channel region is located directly below the gate fingers. The gate cross section for the shortest distance between source and drain is called gate length. The dimension perpendicular to this is the finger length or the transistor gate width. For a single transistor, multiple fingers might be connected in parallel to increase the gate width. The sum of all the finger lengths is then called the gate periphery. Assuming the cross sections of all fingers are identical, the power capability of a transistor is determined by the power capability of a unit finger length multiplied by the total periphery. The number of fingers that a high power transistor can have is determined by various limitations, including for example, the size of the package in which the high power transistor must fit. Also, increasing the length of the fingers increases the gate resistance (Rg) which is another important high frequency parameter. In one high power transistor, to overcome the increase in gate resistance, a low resistivity material, for example, a metal, is run parallel to the gate fingers over the source area to form a gate bus. The gate bus periodically contacts the gate fingers to reduce the gate resistance Rg. Gate pads are placed and sized to allow a contact from the gate bus to be landed. However, lowering the gate resistance in this manner results in a higher parasitic gate-to-source capacitance (Cgs) because of the additional polysilicon gate area needed to facilitate the connection to the gate bus. The higher Cgs has an adverse effect on the performance of the transistor through an increase in the RC time constant and a change in the Cgs characteristic.

Therefore, there is a need to minimize the parasitic Cgs of the transistor while maintaining a low Rg.

DETAILED DESCRIPTION

Generally, the present invention provides, in one embodiment, a high power transistor having a plurality of relatively long parallel gate fingers. Each of the gate fingers has a plurality of gate tabs for connecting the gate fingers to a metal gate bus. The gate fingers and plurality of gate tabs are over an active region. The metal gate bus is for reducing a resistance of the relatively long polysilicon gate fingers. To reduce a gate-to-source capacitance, a relatively thick local insulating layer is used between the gate tabs and the substrate. In the illustrated embodiment, the relatively thick insulator is about four times thicker than the gate dielectric layer that lies between the gate polysilicon and the channel region located directly underneath the gate polysilicon.

Reducing the gate-to-source capacitance allows the high power transistor to have higher frequency capability as compared to prior art transistors having the relatively thin gate oxide between the gate tab and the substrate.

Figure 1:
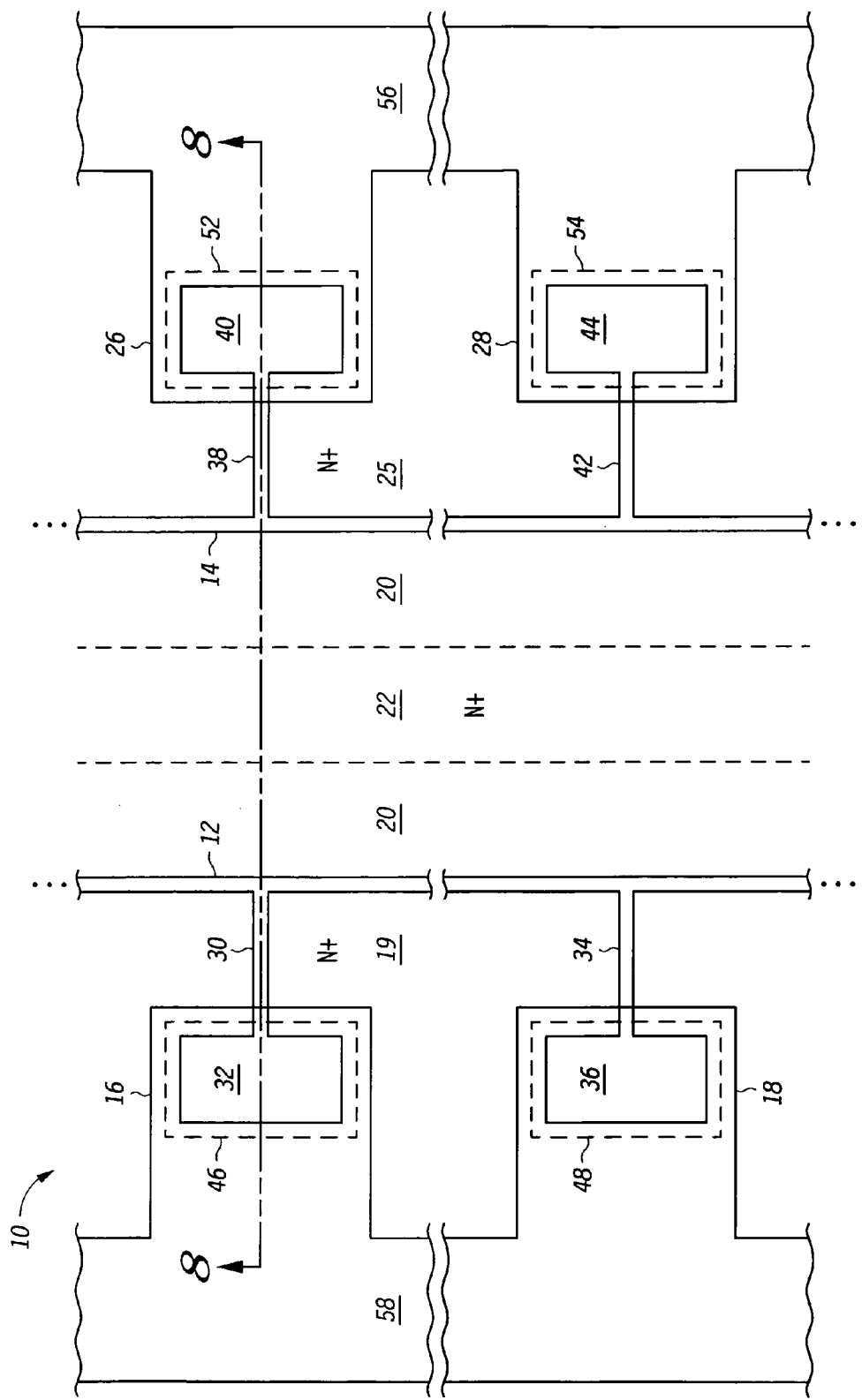
FIG. 1 illustrates, in a top down view, a high power transistor in accordance with the present invention.

FIG. 1 illustrates, in a top down view, a high power RF (radio frequency) transistor 10 in accordance with the present invention. Transistor 10 is a laterally diffused metal oxide semiconductor (LDMOS) transistor formed in a silicon substrate. In one embodiment, high power transistor 10 is a discrete device. In another embodiment, transistor 10 is implemented with other integrated circuits on a semiconductor die (not shown). Transistor 10 includes a plurality of parallel polysilicon gate fingers including gate fingers 12 and 14 formed over an active region in the silicon substrate. An active region is defined as being an area or region of the substrate that highly doped or otherwise has a low resistivity and is electrically part of one of the source, drain, or gate terminals of a transistor. The active region includes channel regions located below gate fingers 12 and 14 and the source and drain regions of the transistor 10 illustrated in FIG. 1. A heavily doped N+ drain region 22 is implanted within lightly doped drain region 20 as indicated by the parallel dashed lines in FIG. 1 that are between gate fingers 12 and 14. N+ source regions 19 and 25 are implanted on the sides of gate fingers 12 and 14 opposite from drain region 22. The amount of power the transistor can provide is determined by the number of gate fingers. There can be any number of gate fingers 12 and 14 and gate fingers 12 and 14 can be any length depending on the amount of available surface area on a semiconductor device having transistor 10. In effect, transistor 10 includes a plurality of transistors coupled in parallel.

Gate buses 56 and 58 are formed from a metal, or other relatively low resistivity material, on either side of gate fingers 12 and 14. The metal may be any metal used in semiconductor manufacturing including aluminum and copper. Gate buses 56 and 58 are connected together (not shown) to form one gate connection. Gate tabs 32 and 36 are two of a plurality of gate tabs formed adjacent to gate bus 58 and are used to connect gate finger 12 to gate bus 58. Likewise, gate tabs 40 and 44 are two of a plurality of gate tabs used to connect gate finger 14 to gate bus 56. There can be any number of gate tabs for connecting a gate finger to a gate bus. All of the gates tabs are located within the active region that forms the source terminal of transistor 10. In other embodiments, the gate tabs may be located with the drain active region of a transistor. For purposes of illustration, only two gate tabs 32 and 36 are connected to gate finger 12 by tab connections 30 and 34, respectively. Gate bus 58 includes gate bus extensions 16 and 18 that extend from gate bus 58 to the gate tabs 32 and 36. The gate bus extension 16 is formed from gate bus 58 and extends over and is contacted to gate tab 32. The gate bus extension 18 is formed from gate bus 58 and extends over and is contacted to gate tab 32. Gate bus 56 includes gate bus extensions 26 and 28 for connecting to gate tabs 40 and 44, respectively. The size of gate tabs 32, 36, 40, and 44 depends, at least in part, on the size of the contact. Conventional semiconductor processing techniques are used to form the contacts.

In the past, the gate dielectric was formed over a relatively large area of the transistor and the gate tabs, being part of the gate polysilicon, were formed over the gate dielectric to insulate the gate tabs from the underlying substrate. The gate structure scales, or can be decreased in size, as semiconductor processes advance. However, the gate tabs cannot necessarily be scaled accordingly, and the effect of the parasitic capacitance associated with the gate tabs becomes more pronounced as the active gate structure is reduced in size. In accordance with one embodiment of the present invention, each of the gate tabs is formed over a relatively thick local oxide layer, or tab insulator. Gate tab 32 is formed over tab insulator 46, gate tab 36 is formed over tab insulator 48, gate tab 40 is formed over tab insulator 52, and gate tab 44 is formed over tab insulator 54. In the illustrated embodiment, oxide layers 46, 48, 40, and 44 are about 100 nanometers (nm) thick and the gate dielectric under gate fingers 12 and 14 is about 240 angstroms thick. The use of a locally thick oxide layer reduces the parasitic capacitance associated with the gate tabs. In other embodiments the tab insulators may have a different thickness, that is, the tab insulators may be thicker than the gate dielectric to reduce capacitance. Also, in other embodiments, the locally thick oxide layer may be used under any other passive part of the gate polysilicon to reduce the parasitic capacitance. Note that the gate contacts are not shown in FIG. 1 but are shown in the cross sectional view of FIG. 8.

Figure 2:
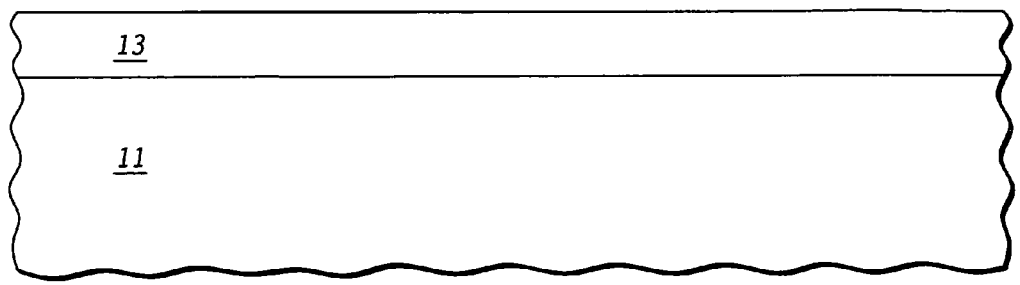
FIGS. 2–8 illustrate, in cross-sectional views along a line 8—8 of the transistor of FIG. 1, a method for forming the transistor of FIG. 1.

FIGS. 2–8 illustrate, in cross-sectional views along a line 8—8 of transistor 10 of FIG. 1, a method for forming high power transistor 10. FIG. 2 illustrates a semiconductor device having a P+ substrate 11 and an insulating layer 13. The insulating layer 13 is formed from an oxide grown on a surface of substrate 11 to a thickness of about 100 nm. Note that the conductivity type of the substrate may be different in other embodiments.

Figure 3:
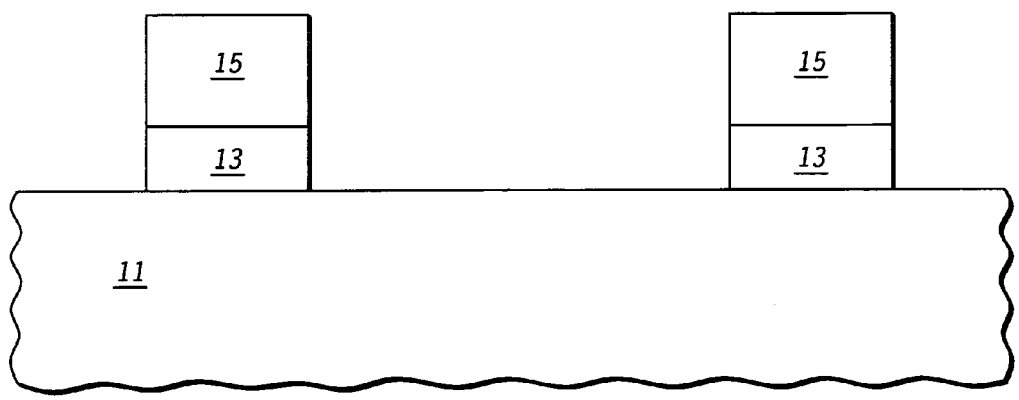

FIG. 3 illustrates a step of patterning insulating later 13 with a patterned photo resist 15 to form the gate tab insulators 46 and 52 of FIG. 1. Insulating layer 13 is etched to remove the oxide not covered by patterned photo resist 15.

Figure 4:

FIG. 4 illustrates the semiconductor device after patterned photo resist 15 is removed to expose gate tab insulators 46 and 52. Gate tap insulators 46 and 52 are about 100 nanometers thick. In the illustrated embodiment, the gate tab insulators are about 4 times thicker than the gate dielectric.

Figure 5:
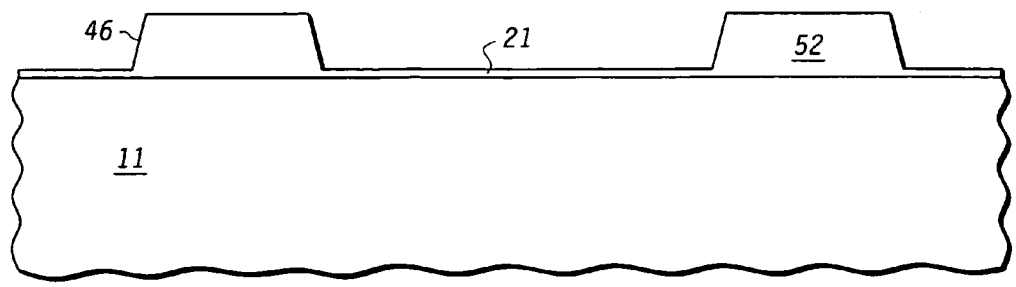

FIG. 5 illustrates forming insulating layer 21 on the surface of substrate 11. Insulating layer 21 functions as a gate dielectric for the polysilicon gate fingers 12 and 14. In the illustrated embodiment, insulating layer 21 is about 240 angstroms thick. In other embodiments, insulating layer 21 may be a different thickness and may be formed from an oxide, nitride, or other insulating material. Also, in other embodiments, insulating layer 21 may be either a low k or a high k dielectric.

Figure 6:
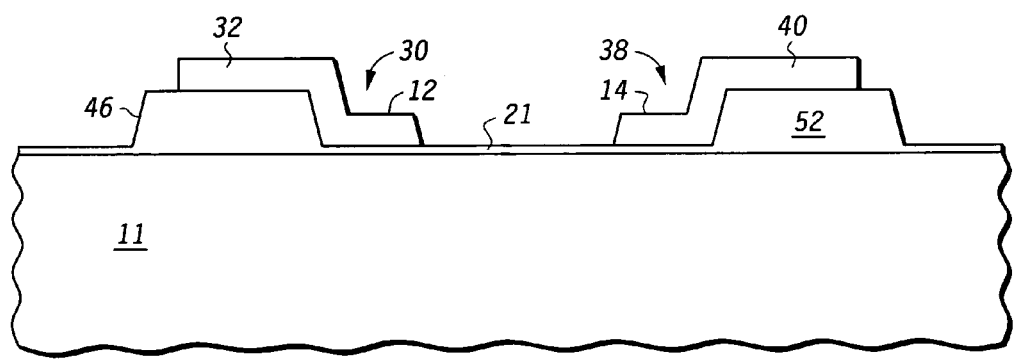

FIG. 6 illustrates polysilicon gate tabs 32 and 40, tab connections 30 and 38, and gate fingers 12 and 14. The polysilicon is deposited over locally thick oxide layers 46 and 52 and insulating layer 21.

Figure 7:
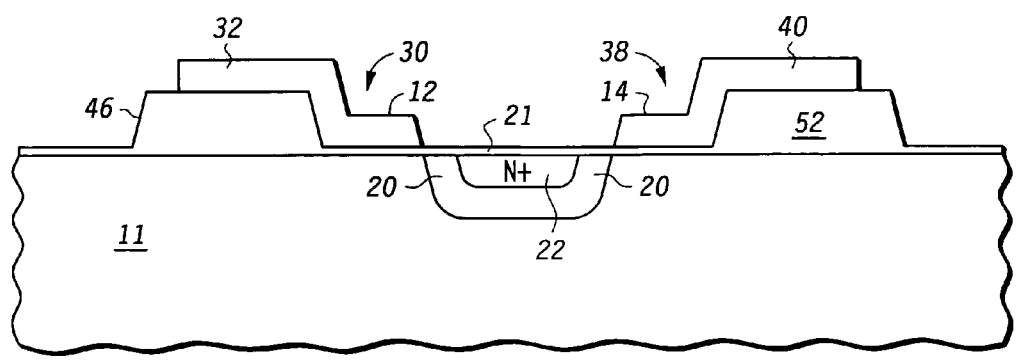

FIG. 7 illustrates the step of implanting N+ drain region 22 and lightly doped drain regions 20 and 24. The N+ source regions, as illustrated in FIG. 1, are also implanted at this step, but do not exist in the area directly under the gate polysilicon so are not visible in the cross-sectional views.

Figure 8:
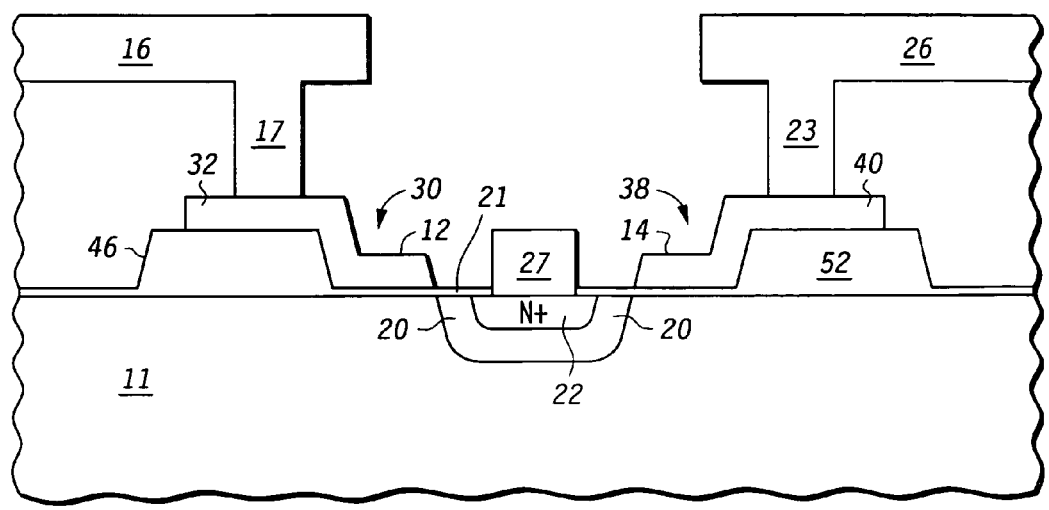

FIG. 8 illustrates metal contacts 17 and 23 formed on gate tabs 32 and 40. A metal drain contact 27 is formed over N+ drain region 22. Gate bus extensions 16 and 26 are formed over contacts 17 and 24. Source contacts are formed on the other side of substrate 11 (not shown). The source contacts are formed using conventional semiconductor processing techniques and are not important for the purpose of describing the present invention.

Locally thick oxide layers 46, 48, 40, and 44 reduce gate-to-source capacitance by reducing the capacitance of the gate tabs. Reducing the capacitance allows transistor 10 to have higher frequency capability and to be more linear as compared to prior art transistors having a relatively thin gate tab insulating layer.

While the invention has been described in the context of a preferred embodiment, it will be apparent to those skilled in the art that the present invention may be modified in numerous ways and may assume many embodiments other than that specifically set out and described above. Accordingly, it is intended by the appended claims to cover all modifications of the invention which fall within the true scope of the invention.

What is claimed is:

1. A semiconductor device, comprising:
an active region in a semiconductor substrate;
a gate finger over a channel in the active region and spaced from the channel by a gate dielectric having a first thickness, wherein the gate finger is of a first material;
a first gate tab adjacent to the gate finger, over the active region and spaced from the substrate by a first tab insulator having a second thickness, wherein the first gate tab is of the first material and the second thickness is greater than the first thickness, wherein the first material is conductive;
a second gate tab adjacent to the gate finger, over the active region and spaced from the substrate by a second tab insulator having the second thickness, wherein the second gate tab is of the first material;
a first tab connection electrically connecting the first gate tab to the gate finger, wherein the first tab connection is of the first material;
a second tab connection electrically connecting the second gate tab to the gate finger, wherein the second gate tab is of the first material; and
a gate bus electrically connected to the first and second gate tabs.

2. The semiconductor device of claim 1, wherein the first material comprises polysilicon and the gate bus comprises a first metal.

3. The semiconductor device of claim 1, further comprising:
a first gate bus extension comprising the first metal, having a portion over the first gate tab, and making electrical contact to the first gate tab and the gate bus; and
a second gate bus extension comprising the first metal, having a portion over the second gate tab, and making electrical contact to the second gate tab and the gate bus.

4. The semiconductor device of claim 3, further comprising:
a lightly-doped drain region adjacent to the gate bus; and
a heavily-doped drain contact region adjacent to the lightly-doped drain region.

5. The semiconductor device of claim 4, further comprising:
a second gate finger over a second channel in the active area and spaced from the second channel by a second gate dielectric having the first thickness, wherein the second gate finger is of the first material;
a second lightly-doped drain region adjacent to a first side of the second gate finger and adjacent to the heavily-doped drain contact region;

a third gate tab adjacent to the second gate finger and spaced from the substrate by a third tab insulator having the second thickness, wherein the third gate tab is of the first material;

a fourth gate tab adjacent to the second gate finger and spaced from the substrate by a fourth tab insulator having the second thickness, wherein the fourth gate tab is of the first material;

a third tab connection electrically connecting the third gate tab to the second gate finger, wherein the third tab connection is of the first material;

a fourth tab connection electrically connecting the fourth gate tab to the second gate finger, wherein the fourth tab connection is of the first material; and a second gate bus electrically connected to the third and fourth gate tabs.

6. The semiconductor device of claim 5, further comprising:

a third gate bus extension comprising the first metal, having a portion over the third gate tab, and making electrical contact to the third gate tab and the second gate bus; and a fourth gate bus extension comprising the first metal, having a portion over the fourth gate tab, and making electrical contact to the fourth gate tab and the second gate bus.

7. The semiconductor device of claim 6, wherein the first material comprises polysilicon and the second gate bus comprises a first metal.

8. The semiconductor device of claim 1, wherein the gate dielectric and the first and second tab insulators comprise oxide.

9. The semiconductor device of claim 1, wherein the first and second tab insulators comprise a low K dielectric.

10. The semiconductor device of claim 1, wherein the second thickness is at least about four times greater than the first thickness.

11. A semiconductor device, comprising:

a semiconductor substrate;

a gate finger spaced from the substrate by a gate dielectric having a first thickness;

a first gate tab adjacent to the gate finger and spaced from the substrate by a first tab insulator having a second thickness;

a second gate tab adjacent to the gate finger and spaced from the substrate by a second tab insulator having the second thickness;

a first tab connection connected to the first gate tab and the gate finger;

a second tab connection connected to the second gate tab; and a gate bus connected to the first and second gate tabs.

12. The semiconductor device of claim 11 wherein the gate finger is over a channel and the first and second gate tabs are spaced from the channel.

13. The semiconductor device of claim 11, wherein the gate bus is connected to the first and second gate tabs through first and second gate bus extensions from the gate bus.

14. The semiconductor device of claim 11, wherein the gate bus is parallel to the gate finger.

15. The semiconductor device of claim 11, wherein the gate bus comprises a metal.

16. The semiconductor device of claim 11, wherein the gate finger comprises polysilicon.

17. The semiconductor device of claim 11, wherein the first and second tab insulators are at least about four times thicker than the gate dielectric.

18. The semiconductor device of claim 11, wherein the first and second tab insulators comprise oxide.

19. The semiconductor device of claim 11, wherein the first and second tab insulators comprise a low K dielectric.

20. In a semiconductor device having contacts to gate tabs over an active region and gate fingers spaced from the active region by a gate dielectric of a first thickness and connected to the gate tabs, the improvement comprising:

tab insulators between the tab connections and the substrate having a thickness greater than the gate dielectric.

21. The semiconductor device of claim 20, wherein the tab insulators have a thickness of at least about four times greater than the thickness of the gate dielectric.

22. The semiconductor device of claim 20, wherein the tab insulators comprise oxide.

23. The semiconductor device of claim 20, wherein the tab insulators comprise a low K dielectric.

* * * * *